United States Patent
Ayoub et al.

(10) Patent No.: US 9,865,431 B2
(45) Date of Patent: *Jan. 9, 2018

(54) APPARATUS AND METHOD FOR TUNING A PLASMA PROFILE USING A TUNING ELECTRODE IN A PROCESSING CHAMBER

(71) Applicant: Applied Materials, Inc., Santa Clara, CA (US)

(72) Inventors: Mohamad A. Ayoub, Los Gatos, CA (US); Jian J. Chen, Fremont, CA (US); Amit Kumar Bansal, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/771,169

(22) PCT Filed: Feb. 12, 2014

(86) PCT No.: PCT/US2014/016098
§ 371 (c)(1),
(2) Date: Aug. 27, 2015

(87) PCT Pub. No.: WO2014/149258
PCT Pub. Date: Sep. 25, 2014

(65) Prior Publication Data
US 2016/0013022 A1 Jan. 14, 2016

Related U.S. Application Data

(60) Provisional application No. 61/792,707, filed on Mar. 15, 2013.

(51) Int. Cl.
*H01L 21/00* (2006.01)
*C23C 16/00* (2006.01)
(Continued)

(52) U.S. Cl.
CPC ...... *H01J 37/32174* (2013.01); *C23C 16/505* (2013.01); *H01J 37/3244* (2013.01);
(Continued)

(58) Field of Classification Search
None
See application file for complete search history.

(56) References Cited

U.S. PATENT DOCUMENTS 4,464,223 A * 8/1984 Gorin ........................ C23F 4/00
156/345.45
5,605,576 A * 2/1997 Sasaki ..................... C23C 14/35
118/723 E (Continued)

FOREIGN PATENT DOCUMENTS

| EP | 2500965 A2 | 9/2012 |
| JP | 2004193567 A | 7/2004 |
| JP | 2009-004289 A | 1/2009 |

OTHER PUBLICATIONS

International Search Report and Written Opinion, PCT/US2014/020788, dated Jun. 23, 2014.
(Continued)

*Primary Examiner* — Parviz Hassanzadeh
*Assistant Examiner* — Anna Crowell
(74) *Attorney, Agent, or Firm* — Patterson + Sheridan, LLP

(57) ABSTRACT

Embodiments of the present invention relate to apparatus for enhancing deposition rate and improving a plasma profile during plasma processing of a substrate. According to embodiments, the apparatus includes a tuning electrode disposed in a substrate support pedestal and electrically coupled to a variable capacitor. The capacitance is controlled to control the RF and resulting plasma coupling to the tuning electrode. The plasma profile and the resulting deposition rate and deposited film thickness across the substrate are (Continued)

correspondingly controlled by adjusting the capacitance and impedance at the tuning electrode.

10 Claims, 4 Drawing Sheets

(51) Int. Cl.
H01J 37/32 (2006.01)
C23C 16/505 (2006.01)

(52) U.S. Cl.
CPC .. *H01J 37/32091* (2013.01); *H01J 37/32715* (2013.01); *H01J 37/32935* (2013.01); *H01J 2237/3321* (2013.01)

(56) References Cited

U.S. PATENT DOCUMENTS

| | | | |
|---|---|---|---|
| 6,270,618 B1* | 8/2001 | Nakano | C23C 16/4405 118/723 E |
| 6,706,138 B2* | 3/2004 | Barnes | H01J 37/3244 156/345.1 |
| 7,004,107 B1 | 2/2006 | Raoux et al. | |
| 7,781,098 B2 | 8/2010 | Chiang et al. | |
| 7,939,584 B2 | 5/2011 | Harris et al. | |
| 8,168,326 B2 | 5/2012 | Chiang et al. | |
| 2002/0186018 A1* | 12/2002 | Sill | H01J 37/321 324/463 |
| 2007/0006972 A1 | 1/2007 | Piptone et al. | |
| 2007/0023398 A1* | 2/2007 | Kobayashi | H01J 37/32027 219/69.12 |
| 2008/0180357 A1* | 7/2008 | Kawakami | H01J 37/32091 345/60 |
| 2009/0229969 A1* | 9/2009 | Hoffman | C23C 14/35 204/192.12 |
| 2009/0230089 A1* | 9/2009 | Bera | H01J 37/32009 216/67 |
| 2009/0236214 A1* | 9/2009 | Janakiraman | C23C 16/45565 204/164 |
| 2010/0018648 A1 | 1/2010 | Collins et al. | |
| 2010/0213047 A1 | 8/2010 | Nagamine et al. | |
| 2010/0252417 A1* | 10/2010 | Allen | C23C 14/345 204/192.12 |
| 2011/0123866 A1 | 5/2011 | Pan et al. | |
| 2011/0143018 A1 | 6/2011 | Peng et al. | |
| 2011/0168550 A1 | 7/2011 | Wang et al. | |
| 2012/0202113 A1 | 8/2012 | Hodge et al. | |
| 2012/0219841 A1 | 8/2012 | Bolandi et al. | |
| 2013/0017340 A1 | 1/2013 | Brown et al. | |
| 2013/0288483 A1* | 10/2013 | Sadjadi | H01L 21/02104 438/710 |
| 2014/0302256 A1* | 10/2014 | Chen | C23C 16/46 427/569 |
| 2016/0013022 A1* | 1/2016 | Ayoub | H01J 37/32091 427/569 |
| 2016/0017494 A1* | 1/2016 | Ayoub | H01J 37/32091 427/569 |

OTHER PUBLICATIONS

International Search Report and Written Opinion, PCT/US2014/016098, dated Jun. 9, 2014.

\* cited by examiner

APPARATUS AND METHOD FOR TUNING A PLASMA PROFILE USING A TUNING ELECTRODE IN A PROCESSING CHAMBER

BACKGROUND OF THE INVENTION

Field of the Invention

Embodiments of the present invention generally relate to an apparatus and method for processing substrates. More particularly, embodiments of the present invention relate to a plasma processing chamber with a tuning electrode disposed in a substrate support pedestal for enhanced processing rate and improved center to edge plasma profile uniformity.

Description of the Related Art

Plasma processing, such as plasma enhanced chemical vapor deposition (PECVD), is used to deposit materials, such as blanket dielectric films on substrates, such as semiconductor wafers. A challenge for current plasma processing chambers and processes includes controlling critical dimension uniformity during plasma deposition processes. A particular challenge includes substrate center to edge thickness uniformity in films deposited using current plasma processing chambers and techniques.

Accordingly, it is desirable to develop an apparatus and process for enhancing deposition rate and improving the center to edge thickness uniformity of films deposited during plasma processing.

SUMMARY OF THE INVENTION

In one embodiment of the present invention, a plasma processing apparatus comprises a chamber body and a powered gas distribution manifold enclosing a process volume, a pedestal disposed in the process volume for supporting a substrate, and a tuning electrode disposed within the pedestal and electrically coupled to a variable capacitor.

In another embodiment, a method for processing a substrate comprises powering a gas distribution manifold using an RF source while flowing one or more process gases into a plasma chamber to form a plasma within a process volume of the chamber and controlling the plasma by varying a capacitance of a tuning electrode disposed within a substrate support pedestal within a chamber body of the chamber.

In yet another embodiment, a substrate support assembly for use in a plasma processing apparatus comprises a substrate support pedestal, a tuning electrode disposed within the substrate support pedestal, and a variable capacitor electrically coupled to the tuning electrode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention relate to apparatus for enhancing deposition rate and improving a plasma profile during plasma processing of a substrate. According to embodiments, the apparatus includes a tuning electrode disposed in a substrate support pedestal and electrically coupled to a variable capacitor. The capacitance is controlled to control the RF and resulting plasma coupling to the tuning electrode. The plasma profile and the resulting deposition film thickness across the substrate are correspondingly controlled by adjusting the capacitance and impedance at the tuning electrode.

Figure 1:
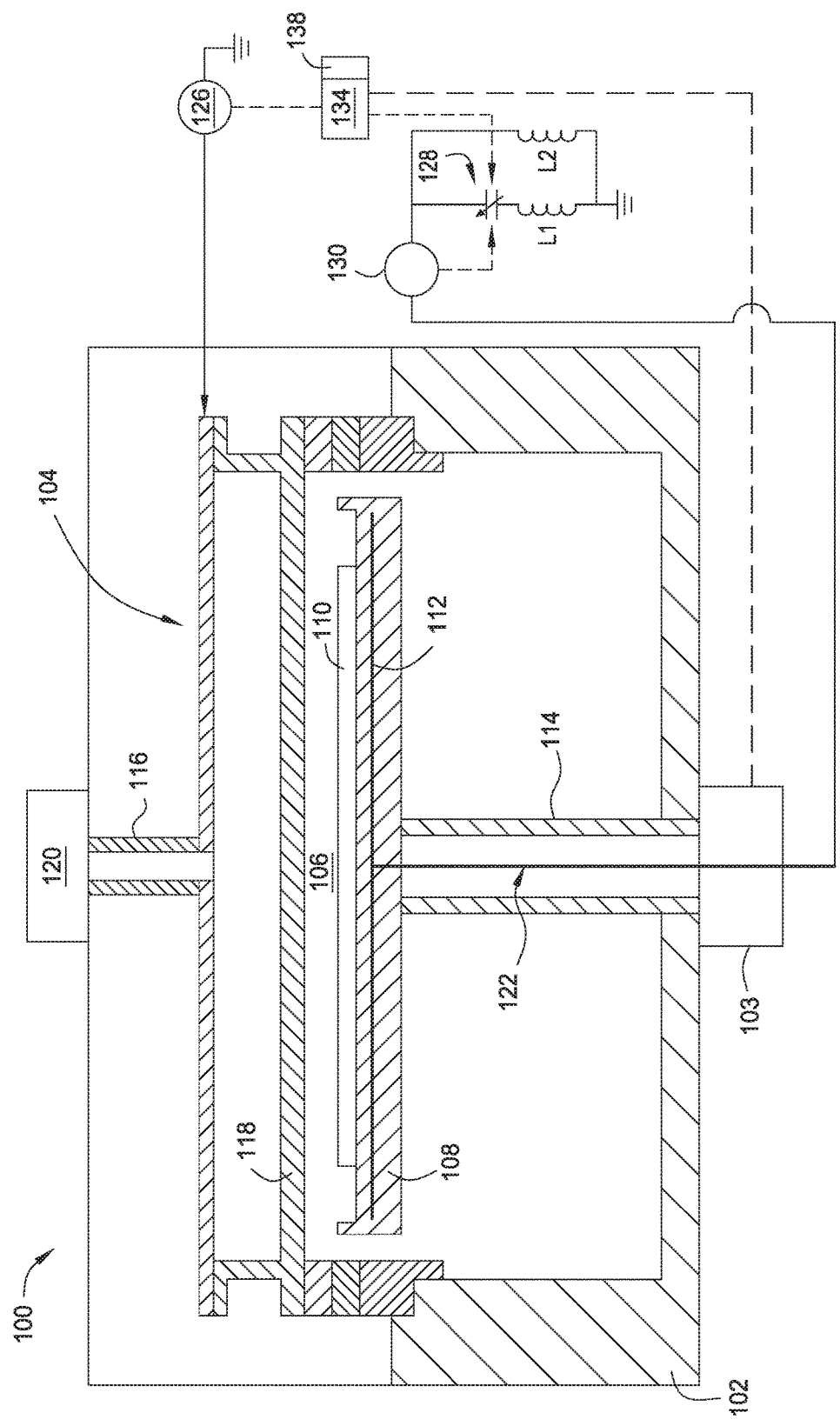
FIG. 1 is a schematic, cross-sectional view of a plasma processing apparatus according to one embodiment of the present invention.

FIG. 1 is a schematic, cross-sectional view of a plasma processing apparatus according to one embodiment of the present invention. The apparatus includes a chamber 100 in which one or more films may be deposited on a substrate 110. The chamber includes a chamber body 102 and a gas distribution assembly 104, which distributes gases uniformly a process volume 106. A pedestal 108 is disposed within the process volume and supports the substrate 110. The pedestal 108 includes a heating element (not shown). The pedestal 108 is movably disposed in the process volume by a stem 114 that extends through the chamber body 102, where it is connected to a drive system 103 for raising, lowering, and/or rotating the pedestal 108.

The gas distribution assembly 104 includes a gas inlet passage 116, which delivers gas from a gas flow controller 120 into a gas distribution manifold 118. The gas distribution manifold 118 includes a plurality of nozzles (not shown) through which gaseous mixtures are injected during processing.

An RF (radio frequency) power source 126 provides electromagnetic energy to power the gas distribution manifold 118, which acts as a powered electrode, to facilitate generation of a plasma between the gas distribution manifold 118 and the pedestal 108. The pedestal 108 includes a tuning electrode 112, which is electrically grounded through an RF rod 122 such that an electric field is generated in the chamber 100 between the powered gas distribution manifold 118 and the tuning electrode 112. In one embodiment, the tuning electrode 112 comprises a conductive mesh, such as an aluminum or molybdenum mesh.

The tuning electrode 112 is electrically coupled to a variable capacitor 128, such as a variable vacuum capacitor, and terminated to ground through an inductor L1. A second inductor L2 is electrically coupled in parallel to the variable capacitor 128 to provide a path for low frequency RF to ground. In addition, a sensor 130, such as a VI sensor, is positioned between the tuning electrode 112 and the variable capacitor 128 for use in controlling the current flow through the tuning electrode 112 and the variable capacitor 128. A system controller 134 controls the functions of the various components, such as the RF power source 126, the drive system 103, and the variable capacitor 128. The system controller 134 executes system control software stored in a memory 138.

Thus, an RF path is established between the powered gas distribution manifold 118 and the tuning electrode 112 via plasma. Further, by changing the capacitance of the variable capacitor 128, the impedance for the RF path through the tuning electrode 112 changes, in turn, causing a change in the RF field coupled to the tuning electrode 112. Therefore, the plasma in the process volume 106 may be modulated across the surface of the substrate 110 during plasma processing.

Figure 2:
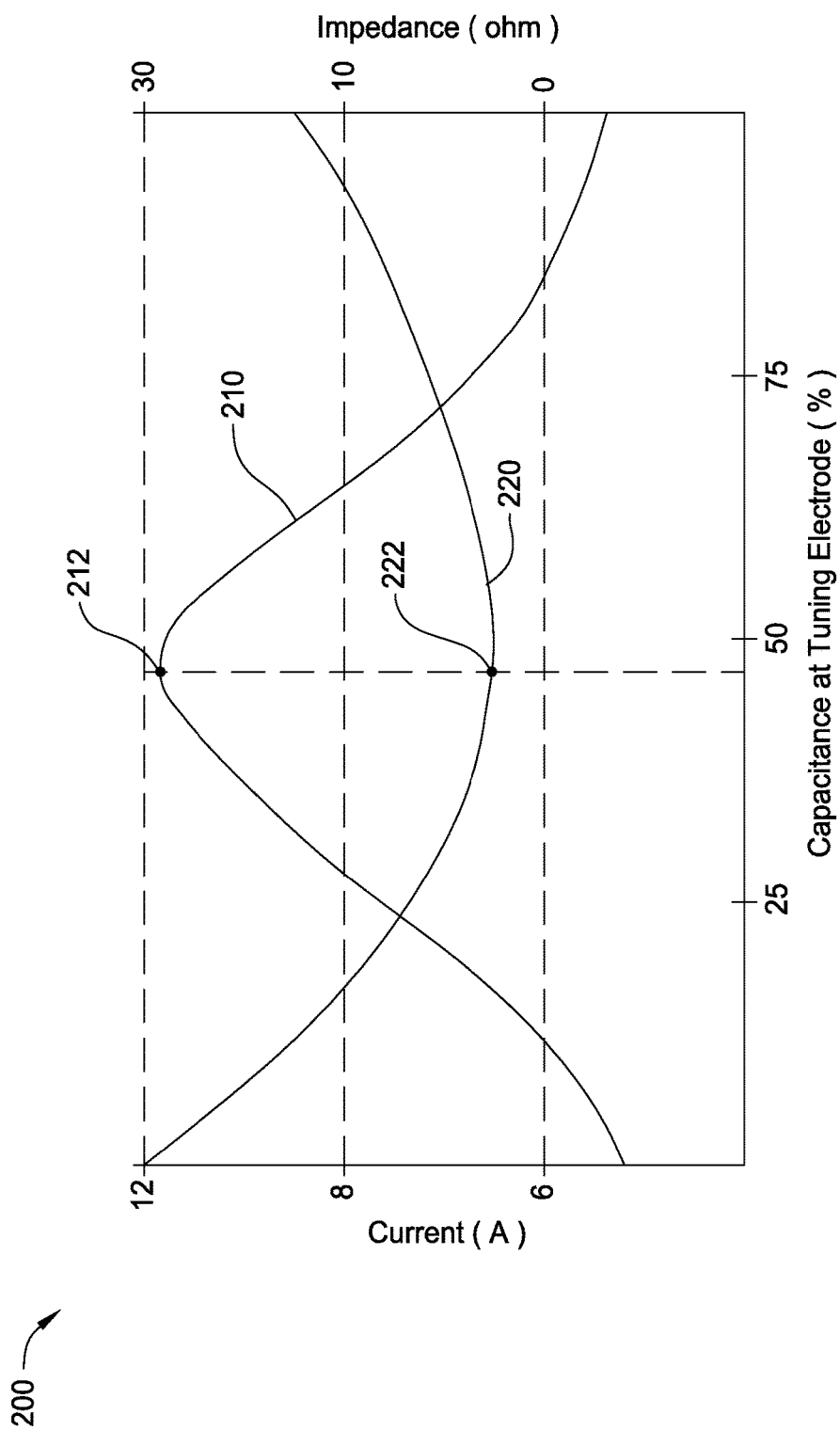
FIG. 2 is an exemplary depiction of the total current and the total impedance of the tuning electrode of FIG. 1, plotted as a function of the percentage of capacitance of the total capacitance at the variable capacitor.

FIG. 2 is an exemplary depiction of the total current 210 and the total impedance 220, of the tuning electrode 112 of FIG. 1, plotted as a function of the percentage of capacitance of the total capacitance at the variable capacitor 128. As can be seen in this example, the maximum current 212 and corresponding minimum impedance 222 of the tuning electrode 112 (i.e., resonance) is achieved at between about 40% and 50% of the total capacitance of the variable capacitor 128. This is due to the resonance of a series LC circuit formed by the inductive RF rod 122, the inductor L1, and the capacitor 128. By tuning the capacitor 128 to the resonance, the inductive impedance of the RF rod 122 can be canceled, and the overall impedance for this RF return path (i.e., from the top surface of the pedestal 108, through the tuning electrode 112, and through the RF rod 122) is minimized, resulting in the maximum possible current flowing through the tuning electrode 112, and thereby enhancing deposition rate. At lower and higher percentages of the total capacitance of the variable capacitor 128, the total current 210 decreases, while the corresponding total impedance 220 increases. Accordingly, a desired current and total impedance of the tuning electrode 112 can be modulated by controlling the total capacitance at the variable capacitor 128.

Figure 3A:
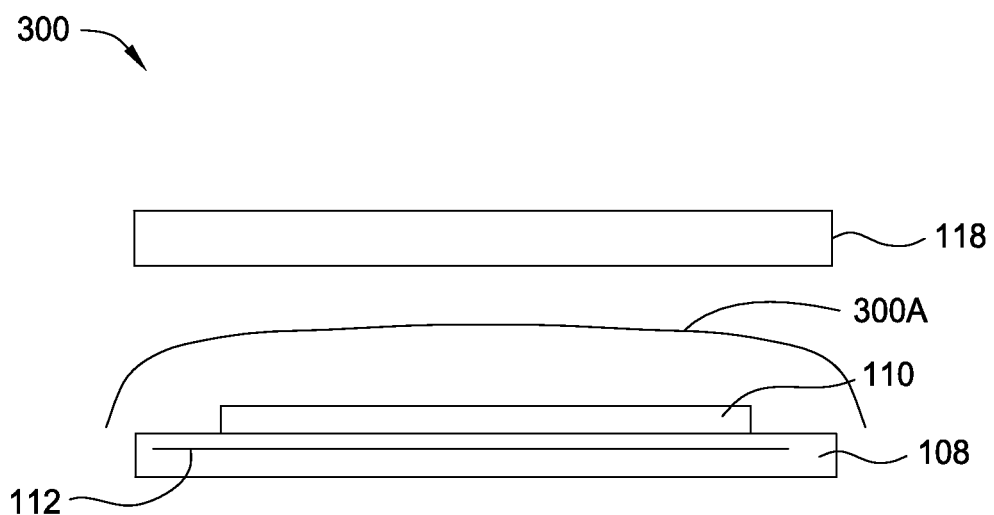
FIGS. 3A-3C are exemplary depictions of the electric field magnitude distribution across the substrate and the pedestal according to varying capacitances applied to the tuning electrode in the chamber of FIG. 1.
Figure 3B:
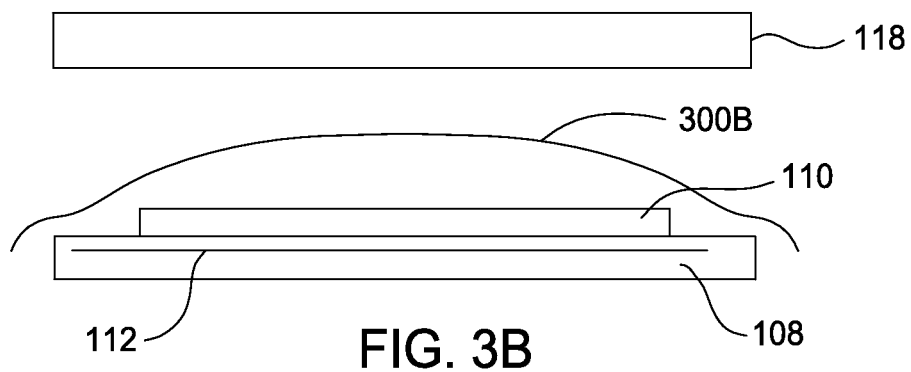
Figure 3C:
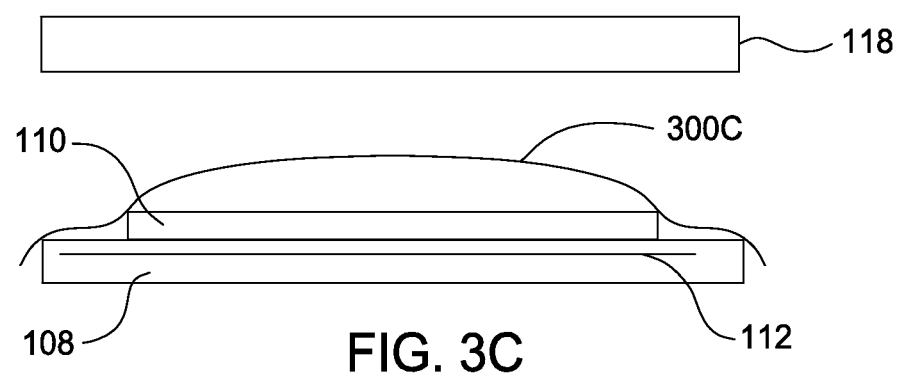

FIGS. 3A-3C are exemplary depictions of the electric field magnitude distribution across the substrate 110 and the pedestal 108 according to varying capacitances applied to the tuning electrode 112 in the chamber 100 of FIG. 1. FIG. 3A depicts the electric field distribution 300A across the substrate 110 and the pedestal 108 with a capacitance of between about 50 pF and about 200 pF (i.e., high impedance) at the variable capacitor 128 coupled to the tuning electrode 112. As can be seen from this example, the electric field is fairly flat across the substrate 110 and the surface of the pedestal 108. This is because, at a high impedance (on capacitive side), the impedance of the substrate 110 has relatively little effect on the total impedance across the tuning electrode 112.

FIG. 3B depicts the electric field distribution 300B across the substrate 110 and the pedestal 108 with a capacitance between about 1000 pF and about 2500 pF at the variable capacitor 128 coupled to the tuning electrode 112. As can be seen from this example, the electric field is lowered at the edge of the substrate 110 and the edge of the pedestal 108 as compared to the example in FIG. 3A because the capacitance is increased and the impedance to the tuning electrode 112 (still on capacitive side) is lowered, and the relative impact of the substrate 110 on the total impedance across the tuning electrode 112 is increased.

FIG. 3C depicts the electric field distribution 300C across the substrate 110 and the pedestal 108 with a capacitance between about 50 nF and about 150 nF (i.e., low impedance) at the variable capacitor 128 coupled to the tuning electrode 112. As can be seen from this example, the electric field is significantly lower at the edge of the substrate 110 and the edge of the pedestal 108 as compared to the examples in FIGS. 3A-3B. This is because at very low impedance in the pedestal 108 due to the tuning electrode 112, the impedance of the substrate 110 has a significantly greater effect on the total impedance than when the tuning electrode has a significantly higher impedance.

From the examples shown in FIGS. 3A-3C, it is clear that varying the capacitance in the variable capacitor 128 electrically coupled to the tuning electrode 112 results in a corresponding variation in the electric field across the surface of the substrate 110 and the pedestal 108. In particular, increasing the capacitance in the variable capacitor 128, and the corresponding decrease in the impedance through the tuning electrode 112, results in a decreased magnitude of the electric field at the edge of the substrate 110 and the edge of the pedestal 108 due to the RF coupling between the gas distribution manifold 118 and the tuning electrode 112 and the effect of the impedance of the substrate 110 relative to the overall impedance of the tuning electrode 112. Further, since the electric field is the power driver for generating the plasma in the chamber 100, it follows that increasing the magnitude of the electric field at the edge of the substrate 110 also increases the plasma density at the edge of the substrate 110. As a result, not only is the electric field across the surface of the substrate 110 being processed varied, but the plasma profile across the surface of the substrate 110 is correspondingly varied by varying the capacitance in the variable capacitor 128 electrically coupled to the tuning electrode 112. Correspondingly, the resulting film thickness profile deposited on the substrate 110 correlates with the plasma profile, resulting in the capability of varying the deposition film thickness profile by varying the capacitance in the variable capacitor 128 electrically coupled to the tuning electrode 112.

Figure 4A:
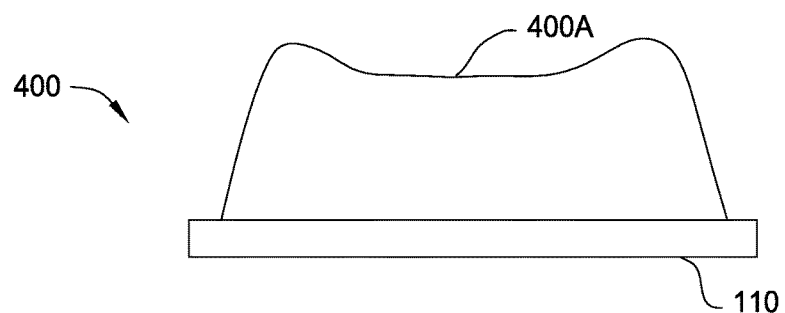
FIGS. 4A-4D are exemplary depictions of the resulting film thickness distribution across the substrate, processed in the chamber in FIG. 1, using varying capacitances applied to the tuning electrode during plasma deposition processing.

FIGS. 4A-4D are exemplary depictions of the resulting film thickness distribution across the substrate 110, processed in the chamber 100, using varying capacitances applied to the tuning electrode 112 during plasma deposition processing. FIG. 4A depicts the film thickness distribution across the substrate 110 with the variable capacitor 128 set at 22% of its maximum capacitance. As can be seen from this example, the film thickness 400A is high near the edge of the substrate 110 as compared to the film thickness at the center of the substrate 110, and then abruptly drops to the minimum level before reaching the very edge.

Figure 4B:
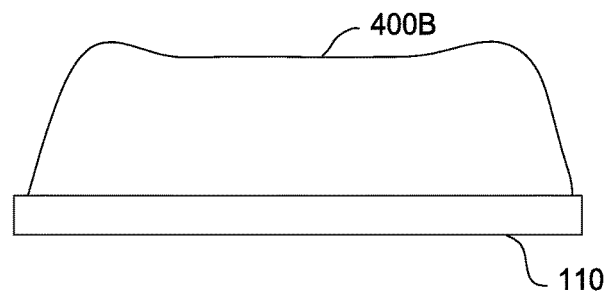

FIG. 4B depicts the film thickness distribution across the substrate 110 with the variable capacitor 128 set at 28% of its maximum capacitance. As can be seen from this example, by increasing the capacitance in the variable capacitor 128 (i.e., decreasing impedance), the film thickness 400B is lowered at the edge of the substrate 110 with respect to the film thickness at the center of the substrate 110 as compared to the example in FIG. 4A, and then stretched out towards the edge of the substrate 110.

Figure 4C:
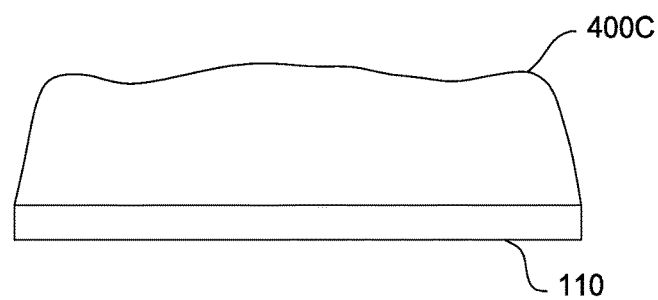

FIG. 4C depicts the film thickness distribution across the substrate 110 with the variable capacitor 128 set at 32% of its maximum capacitance. As can be seen from this example, by further increasing the capacitance in the variable capacitor 128, the film thickness 400C is further lowered at the edge of the substrate 110 with respect to the film thickness at the center of the substrate 110 as compared to the example in FIG. 4B, and further stretched out towards the edge of the substrate 110. As a result, the film thickness 400C is relatively uniform across the surface of the substrate 110.

Figure 4D:
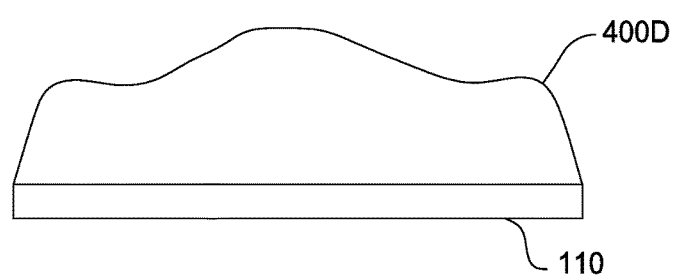

FIG. 4D depicts the film thickness distribution across the substrate 110 with the variable capacitor 128 set at 36% of its maximum capacitance. As can be seen from this example, by further increasing the capacitance in the variable capacitor 128, the film thickness 400C is substantially lowered at the edge of the substrate 110 with respect to the film thickness at the center of the substrate 110 as compared to the example in FIG. 4C. As a result, the profile of the film thickness 400D is flipped over to the edge-low, center-high profile from the edge-high, center-low profile of the film thickness 400A shown in FIG. 4A.

From the examples shown in FIGS. 4A-4D, it is clear that varying the capacitance in the variable capacitor 128 electrically coupled to the tuning electrode 112 results in a corresponding variation in the deposited film thickness across the surface of the substrate 110. In particular, increasing the capacitance in the variable capacitor 128, and correspondingly decreasing the impedance at the tuning electrode 112 and decreasing the electric field magnitude at the edge of the substrate 110 with respect to the center as shown in FIGS. 3A-3C, results in a decrease in the corresponding edge film thickness with respect to the center film thickness of the substrate 110. Thus, the varying the capacitance in the variable capacitor 128 coupled to the tuning electrode 112 allows for control of the film thickness profile (center to edge) across the surface of the substrate 110 being processed.

While the foregoing is directed to embodiments of the present invention, other and further embodiments of the invention may be devised without departing from the basic scope thereof, and the scope thereof is determined by the claims that follow.

The invention claimed is:

1. A plasma processing apparatus, comprising:
   a chamber body and a gas distribution manifold enclosing a process volume, wherein the gas distribution manifold is attachable to a power supply;
   a pedestal disposed in the process volume for supporting a substrate;
   a tuning electrode disposed within the pedestal;
   a sensor having a first terminal and a second terminal, wherein the tuning electrode is electrically coupled directly to the first terminal of the sensor;
   a variable capacitor having a first terminal electrically coupled directly to the second terminal of the sensor;
   a first inductor having a first terminal electrically coupled directly to a second terminal of the variable capacitor and a second terminal electrically coupled to ground; and
   a second inductor having a first terminal electrically coupled directly to the second terminal of the sensor and a second terminal electrically coupled to ground, wherein the second inductor is directly connected in parallel to the first inductor and the variable capacitor.

2. The plasma processing apparatus of claim 1, wherein the variable capacitor is coupled to a controller configured to control the capacitance of the variable capacitor.

3. The plasma processing apparatus of claim 1, wherein the variable capacitor is coupled to a controller configured to control the current flowing through the variable capacitor.

4. The plasma processing apparatus of claim 1, wherein the tuning electrode comprises a conductive mesh.

5. The plasma processing apparatus of claim 1, wherein the variable capacitor is a variable vacuum capacitor.

6. A substrate support assembly for use in a plasma processing apparatus, comprising:
   a substrate support pedestal;
   a tuning electrode disposed within the substrate support pedestal;
   a sensor having a first terminal and a second terminal, wherein the tuning electrode is electrically coupled directly to the first terminal of the sensor;
   a variable capacitor having a first terminal electrically coupled directly to the second terminal of the sensor;
   a first inductor having a first terminal electrically coupled directly to a second terminal of the variable capacitor and a second terminal electrically coupled to ground; and
   a second inductor having a first terminal electrically coupled directly to the second terminal of the sensor and a second terminal electrically coupled to ground, wherein the second inductor is directly connected in parallel to the first inductor and the variable capacitor.

7. The substrate support assembly of claim 6, wherein the variable capacitor is a variable vacuum capacitor.

8. The substrate support assembly of claim 6, wherein the tuning electrode comprises a conductive mesh.

9. The substrate support assembly of claim 6, wherein the variable capacitor is coupled to a controller configured to control the capacitance of the variable capacitor.

10. The substrate support assembly of claim 6, wherein the variable capacitor is coupled to a controller configured to control the current flowing through the variable capacitor.

* * * * *